(12) United States Patent
Barot et al.

(10) Patent No.: US 11,552,619 B2
(45) Date of Patent: Jan. 10, 2023

(54) ADAPTIVE HYSTERETIC CONTROL FOR A POWER CONVERTER

(71) Applicant: TEXAS INSTRUMENTS INCORPORATED, Dallas, TX (US)

(72) Inventors: Kashyap Jayendra Barot, Bangalore (IN); Suvadip Banerjee, Kolkata (IN); Sreeram Subramanyam Nasum, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/377,087

(22) Filed: Jul. 15, 2021

(65) Prior Publication Data
US 2022/0038079 A1 Feb. 3, 2022

(30) Foreign Application Priority Data

Jul. 29, 2020 (IN) .............................. 202041032406

(51) Int. Cl.
*H03K 3/0233* (2006.01)
*H02M 1/00* (2006.01)
*H02M 3/335* (2006.01)
*H02M 1/08* (2006.01)
*H02M 1/14* (2006.01)

(52) U.S. Cl.
CPC ...... *H03K 3/02337* (2013.01); *H02M 1/0025* (2021.05); *H02M 1/08* (2013.01); *H02M 1/14* (2013.01); *H02M 3/33592* (2013.01)

(58) Field of Classification Search
CPC .. H03K 3/02337; H02M 1/0025; H02M 1/08; H02M 1/14; H02M 3/33592

USPC .......................................................... 327/205
See application file for complete search history.

(56) References Cited

U.S. PATENT DOCUMENTS

| 7,990,126 B1 | 8/2011 | Zhang et al. |
| 8,138,739 B1 | 3/2012 | Eirea et al. |
| 2012/0133345 A1 | 5/2012 | Tai et al. |

FOREIGN PATENT DOCUMENTS

| GB | 2452790 | 3/2009 | |
| GB | 2452790 A | * 3/2009 | ............. H03F 3/217 |

OTHER PUBLICATIONS

Kim, et al.; "Adaptive Frequency-Controlled Ultra-Fast Hysteretic Buck Converter for Portable Devices"; IEEE College of Information & Communication Engineering; Sungkyunkwan University; and Samsung Electronics; 2012 4 pages.
Liu, et al.; "Adaptive Hysteresis Band Control for Converter with Low Output Ripple and Constant Switching Frequency"; College of Electrical Engineering, Shanghai University of Electric Power; Shanghai, China; IEEE; 4 pages.

(Continued)

*Primary Examiner* — Tomi Skibinski
(74) *Attorney, Agent, or Firm* — Valerie M. Davis; Frank D. Cimino

(57) ABSTRACT

An apparatus includes a first control circuit having an output and including a first comparator and a second control circuit coupled to the output of the first control circuit. The second control circuit includes a second comparator configured to: compare a first value to a reference frequency value, the first value indicating a frequency of a signal at the output of the first control circuit; and provide an adjustment value to change a hysteresis window of the first comparator.

19 Claims, 9 Drawing Sheets

(56) References Cited

OTHER PUBLICATIONS

Zhao, et al.; "Adaptive Hysteresis Band Control for DC-DC Buck Converter"; Electric Power Engineering, Shanghai University of Electric Power; Shanghai, P.R. China; and Department of Automation, Tsinghua University, Beijing; IEEE; 2013; 6 pages.
Wu, et al.; "Adaptive Hysteresis Window Control (AHWC) Technique for Hysteretic DC-DC BUCK Converter with Constant Switching Frequency"; Institute of VLSI Design, Zhejiang University; IEEE; 2010; 4 pages.
Product Sheet: Analog Devices, Inc.; "Quad-Channel Isolators with Integrated DC-to-DC Converters"; Data Sheet: ADuM6410/ADuM6411/ADuM6412: Jul. 2016; 29 pages.
Product Sheet: Texas Instruments, Inc.; ISOW784x High-performance, 5000-V RMS reinforced quad-channel digital isolators with integrated high-efficiency, low-emissions DC-DC converter; ISOW7840, ISOW7841, ISOW7842, ISOW7843 and ISOW7844; Mar. 2017; 51 pages.

\* cited by examiner

ADAPTIVE HYSTERETIC CONTROL FOR A POWER CONVERTER

CROSS REFERENCE TO RELATED APPLICATIONS

This application claims priority to India Provisional Patent Application No. 202041032406 filed Jul. 29, 2020, which is incorporated herein by reference.

TECHNICAL FIELD

This relates generally to power converters, and more particularly to adaptive hysteretic control for power converters.

BACKGROUND

A power converter (also referred to herein simply as a converter), such as an alternating current to direct current (AC-DC) or DC-DC converter, may be used in a system such as a power supply to power a load. A load may include a motor, a computer, etc. Some power converters include switching circuitry that turns the power converter on and off to provide a regulated DC signal, e.g., a regulated voltage and/or current. Output signal regulation may be achieved using closed-loop feedback control, whereby a signal that is based on, e.g., a fraction of, the regulated output signal is compared to a reference signal. The result of this comparison is used to control the switching circuitry for the power converter. Despite including the closed-loop feedback control, the regulated output signal may have "ripple." "Ripple," which is characterized by ripple amplitude and ripple frequency, is variation from a target output signal. Ripple amplitude reflects an amount or level of deviation from a target output value, and ripple frequency reflects a frequency of that deviation. In a system including a power converter, one or both of ripple amplitude and ripple frequency of the regulated output signal may be exacerbated by transients in the load current. Proper control of both the ripple amplitude and the ripple frequency reduces potential negative impact on other circuitry within the system.

SUMMARY

In one example, an apparatus includes a first control circuit having an output and including a first comparator and a second control circuit coupled to the output of the first control circuit. The second control circuit includes a second comparator configured to: compare a first value to a reference frequency value, the first value indicating a frequency of a signal at the output of the first control circuit; and provide an adjustment value to change a hysteresis window of the first comparator.

In another example, an apparatus includes a first circuit including a power converter having a control input and a converter output and a first control circuit having a feedback input and a control output, the control output coupled to the control input. The apparatus also includes a second control circuit and a third control circuit. The second control circuit has an input and a feedback output, wherein the input of the second control circuit is coupled to the converter output, and the feedback output is coupled to the feedback input. The second control circuit includes a first comparator. The third control circuit is coupled to the feedback output and includes a second comparator. The comparator is configured to compare a first value to a reference frequency value, the first value indicating a frequency of a signal at the feedback output and provide an adjustment value to change a hysteresis window of the first comparator.

In another example, a method includes receiving an output signal and comparing the output signal to a hysteresis window and responsively generating a feedback signal, the feedback signal having a frequency. The method also includes comparing a first value indicating the frequency to a reference frequency value, and responsively generating an adjustment value. The method further includes adjusting the hysteresis window based on the adjustment value.

BRIEF DESCRIPTION OF THE DRAWINGS

In the drawings, like reference numerals refer to like elements throughout, and the various features are not necessarily drawn to scale.

DETAILED DESCRIPTION OF EXAMPLE EMBODIMENTS

Figure 1:
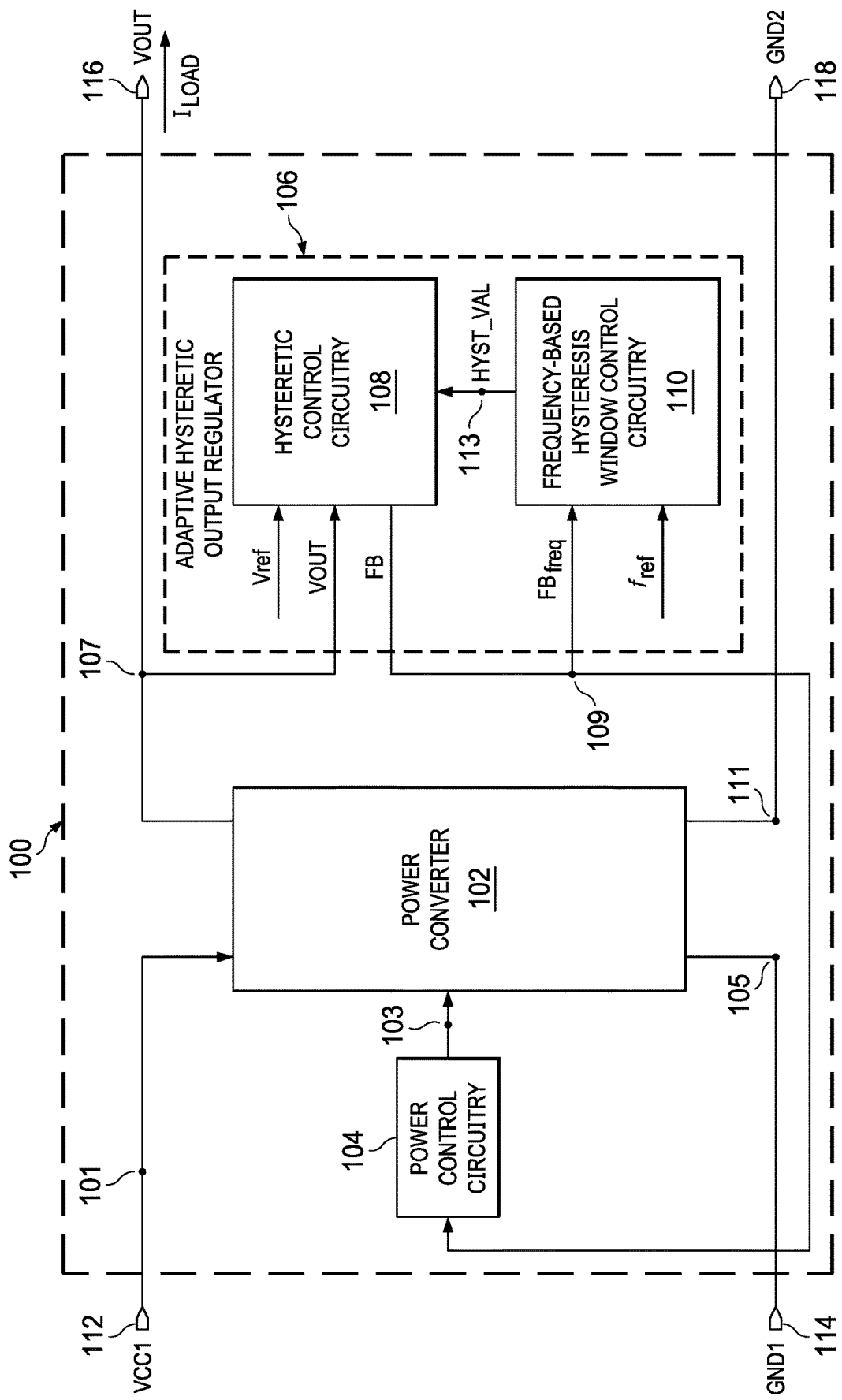
FIG. 1 is a block diagram depicting a system including example circuitry for adaptive hysteretic control of a power converter.

Some closed-loop feedback control methods are effective at controlling either ripple amplitude or ripple frequency, but not both, of the regulated output signal of a power converter. For example, pulse-width modulation (PWM) feedback control effectively controls the ripple frequency. However, a disadvantage of this method includes large overshoots and undershoots (e.g., more than 200 mV) of the target DC output signal during load transients. Such voltage spikes could damage certain loads. Increasing decoupling capacitance at the converter output can reduce the ripple amplitude but at the expense of an increase in system cost. Another disadvantage is a slow transient response of the regulated output signal due to a limited loop bandwidth used to stabilize the system. For example, the loop bandwidth may be 30 kHz compared to a 625 kHz PWM frequency.

By contrast, hysteretic feedback control benefits from: a fast transient response of the regulated output signal (e.g., 200 ns); and effective control of ripple amplitude, for instance to within 10 mV. However, some hysteretic feedback control methods suffer from degraded control of the ripple frequency (for both increasing input and output voltages) as compared to PWM feedback control, particularly when using a fixed hysteresis window. Lack of control of the ripple frequency may generate electromagnetic disturbances, such as electromagnetic emissions that interfere with other nearby circuitry.

Some hysteretic feedback control methods using a hysteresis window that is adapted or adjusted based on input and output voltages of the converter have been proposed for use with buck converters to reduce ripple frequency variation. These adaptive hysteretic feedback control methods use open loop correction and include a differentiator which determines adjustments to the hysteresis window to regulate ripple frequency. Using these proposed topologies, effective ripple frequency control can be maintained even as the input voltage increases. However, ripple frequency control degrades with increasing output voltage. Moreover, the differentiator introduces cost and complexity to the system, and load transients further reduce the effectiveness of the open loop correction.

Described examples include circuits and a method that facilitates adaptive hysteretic feedback control (or simply adaptive hysteretic control) for a power converter based on ripple frequency. Example benefits of the adaptive hysteretic control of the described examples include: maintaining the ripple amplitude within a target range with a fast transient response of the regulated output signal; using closed-loop circuitry to control ripple frequency at a target value or within a target range in the presence of load transients; and improving ripple amplitude at larger decoupling capacitances. Moreover, some examples control ripple frequency for non-linear variation with load. Also, some examples can be applied to control ripple frequency in isolated DC-DC converters or other converter types, such as other DC-DC converter types.

According to a first example, FIG. 1 illustrates a block diagram depicting a system 100 including example circuitry for adaptive hysteretic control of a power converter based on ripple frequency. Namely, system 100 includes a power converter (or simply converter) 102, power control circuitry (or simply control circuitry) 104, a hysteretic output regulator 106, and pins and/or pads 112-118. For simplicity, elements 112-118 are referred to as pins. The hysteretic output regulator 106 includes hysteretic control circuitry 108 and frequency-based hysteresis window control circuitry (or simply hysteresis window control circuitry) 110. Circuits 104, 108, and 110 (and implementations thereof in other figures) are referred to herein as control circuits.

Although not all separately labeled in the FIGS. (e.g., 1, 2, 3, 5, and 10), components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects. Moreover, the system 100 may be a single integrated circuit (IC) or IC package built on a single piece of silicon and having pins 112-118. Alternatively, the system 100 is integrated into multiple ICs and/or multiple IC packages (each package having one or more ICs), with the multiple ICs or IC packages coupled to or mounted on a printed circuit board (PCB) having pads 112-118.

As illustrated, a (voltage) input of converter 102 is coupled to pin 112 at a node 101. An output of converter 102 is coupled to pin 116 and to a (voltage) input of hysteretic control circuitry 108 at a node 107. A (control) input of the converter 102 is coupled to a (control) output of control circuitry 104 at a node 103. A first (reference, e.g., ground) terminal of converter 102 is coupled to pin 114 at a node 105, and a second (reference, e.g., ground) terminal of converter 102 is coupled to pin 118 at a node 111. A (feedback) output of hysteretic control circuitry 108 is coupled to a (feedback) input of hysteresis window control circuitry 110 and to a (feedback) input of control circuitry 104 at a node 109. A (reference) input of hysteretic control circuitry 108 is coupled to circuitry (not shown) that provides a reference voltage $V_{ref}$. A (reference) input of hysteresis window control circuitry 110 is coupled to circuitry (not shown) that provides a reference frequency $f_{ref}$, and a (hysteresis) output of hysteresis window control circuitry 110 is coupled to a (hysteresis) input of hysteretic control circuitry 108 at a node 113.

As further illustrated, pin 112 receives a voltage, e.g., an AC or DC voltage, $V_{CC1}$, which is provided to the voltage input of converter 102. Pin 114 is coupled to a first common reference voltage, e.g., a first electrical ground (or simply ground), $GND_1$. Pin 116 provides a voltage, e.g., a regulated DC voltage, $V_{OUT}$, from the output of the converter 102. Pin 118 is coupled to a second common reference voltage, e.g., a second ground, $GND_2$. Pins 114 and 118 are shown in this example as respectively coupled to different grounds, for instance to facilitate electrical isolation between different voltage domains. However, in another example, pins 114 and 118 are coupled to the same ground.

In one implementation, the converter 102 is a "switching" converter that includes switching circuitry (not shown) that uses switched mode operation to turn or switch the converter 102 on and off (e.g., to an ON or conductive state and an OFF or non-conductive state) at a switching frequency in order to provide a regulated DC output signal, in this case $V_{OUT}$. The switching circuitry may include one or more switches, e.g., one or more transistors, such as field effect transistors, operating as switches. Example switching converter types include, but are not limited to, buck, boost, buck-boost, and flyback converters. Example switching converter topologies that include multi-transistor switching circuitry are push-pull, half-bridge, and full-bridge converters, which may provide one or multiple regulated output signals.

The power control circuitry 104 provides signals that control the switching circuitry to turn the converter 102 on and off at the switching frequency to generate $V_{OUT}$. A load (not shown) may be coupled to pin 118 to receive $V_{OUT}$. While receiving $V_{OUT}$ the load draws a current, $I_{LOAD}$. $I_{LOAD}$ may have transients or changes, e.g., instantaneous or nearly instantaneous changes, for example during power-up and/or power-down of the load.

The hysteretic output regulator 106 is configured to regulate the ripple amplitude and ripple frequency of $V_{OUT}$, for instance responsive to the transients of $I_{LOAD}$. More particularly, the hysteretic control circuitry 108 is configured to monitor a voltage based on, e.g., that is a fraction of, the output voltage $V_{OUT}$ and determine whether the amplitude (which indicates ripple amplitude) is within a hysteresis window defined or characterized by an upper voltage threshold and a lower voltage threshold. In this example, the hysteretic control circuitry 108 sets the upper and lower thresholds of the hysteresis window relative to $V_{ref}$. Based on whether the voltage is within or outside of the hysteresis window, the hysteretic control circuitry 108 provides and/or adjusts a feedback signal, FB. The control circuitry 104 uses FB to adjust a duty cycle of the switching circuitry to regulate, including controlling the ripple amplitude, of $V_{OUT}$. Moreover, the hysteresis window control circuitry 110 is configured to control adjustments to the hysteresis window, to thereby control the ripple frequency of $V_{OUT}$. Namely, the hysteresis window control circuitry 110 is configured to monitor the frequency of FB ($FB_{freq}$, which indicates the ripple frequency) and compare the frequency of FB (or a fraction thereof) to $f_{ref}$ to determine whether to adjust or to control adjustments to the hysteresis window, for instance using an adjustment signal and/or value HYST_VAL, to maintain the ripple frequency at a target value or within a target range. Example implementations of the system 100 are illustrated in FIGS. 2, 3, 5, and 10.

Figure 2:
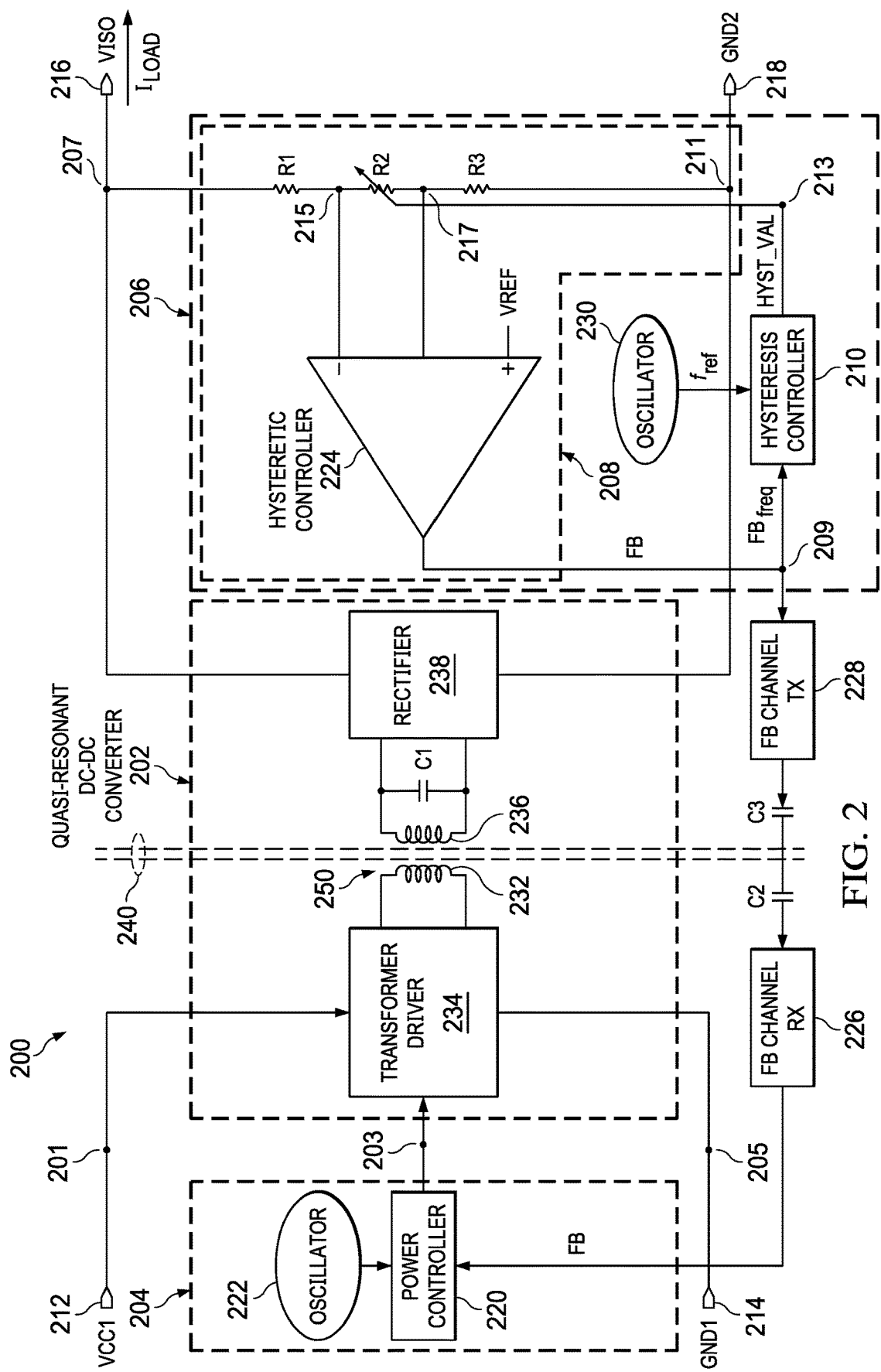
FIG. 2 is a block and schematic diagram depicting a system including example circuitry for adaptive hysteretic control of a quasi-resonant DC-DC converter.

More particularly, FIG. 2 is a block diagram depicting a system 200 including example circuitry for adaptive hysteretic control of a quasi-resonant DC-DC converter based on ripple frequency. System 200 includes a quasi-resonant DC-DC converter 202, power control circuitry 204, a hysteretic output regulator 206, feedback (FB) channel receive (RX) circuitry 226, FB channel transmit (TX) circuitry 228, isolation capacitors C2 and C3 each having respective first and second (capacitor) terminals coupled to respective first and second plates, and pins and/or pads 212-218. For simplicity, elements 212-218 are referred to as pins.

In one example, the system 200 is or is included in a power supply system that may also include other circuits, components, and/or sub-systems not shown. In another example, control circuitry 204 is an implementation of control circuitry 104 of FIG. 1. Converter 202 is an implementation of converter 102 of FIG. 1, and hysteretic output regulator 206 is an implementation of hysteretic output regulator 106 of FIG. 1. Moreover, the system 200 may be integrated into a single IC or IC package built on a single piece of silicon and having pins 212-218. Alternatively, the system 200 is integrated into multiple ICs and/or multiple IC packages (each package having one or more ICs), with the multiple ICs or IC packages coupled to or mounted on a PCB having pads 212-218. In another example, one or more of the passive components, such as capacitors and resistors, in system 200 are discreet components.

As illustrated, converter 202 includes a transformer 250 including a primary winding 232 and a secondary winding 236, a capacitor C1 having first and second (capacitor) terminals coupled to respective first and second plates, a transformer driver circuit (or simply transformer driver) 234, and a rectifier circuit (or simply rectifier) 238. Control circuitry 204 includes an oscillator circuit (or simply oscillator) 222 and a power controller 220.

Also illustrated, a (voltage) input of transformer driver 234 is coupled to pin 212 at a node 201. An output of rectifier 238 is coupled to pin 216 at a node 207. A (control) input of transformer driver 234 is coupled to a (control) output of control circuitry 204 at a node 203. A (reference, e.g., ground) terminal of transformer driver 234 is coupled to pin 214 at a node 205, and a (reference, e.g., ground) terminal of rectifier 238 is coupled to pin 218 at a node 211. Additionally, terminals of primary winding 232 of transformer 250 are respectively coupled to outputs of transformer driver 234. Terminals of secondary winding 236 of transformer 250 are respectively coupled to inputs of rectifier 238 and to the terminals of capacitor C1, such that secondary winding 236 is coupled in parallel with capacitor C1 across the inputs of rectifier 238. Also, a (frequency) output of oscillator 222 is coupled to a (frequency) input of power controller 220.

Transformer driver 234 includes switching circuitry (not shown), e.g., including one or more transistors operating as switches. The one or more transistors are switched on and off at a switching frequency using signals provided to respective control terminals of the one or more transistors. The on and off switching allows power from an input signal supplied at pin 212 to be provided to primary winding 232, transferred to secondary winding 236, and rectified by rectifier 238 to generate a regulated output signal at the output of rectifier 238, which is provided to the pin 216. In an example, rectifier 238 includes diodes arranged into a half-bridge or full-bridge topology. Power controller 220 may include one or more amplifiers, comparators, and other circuitry and/or logic that operate, at least partially under the control of the hysteretic output regulator 206, to regulate the output signal.

As further illustrated, the transformer 250 is an "isolation" transformer, in which windings 232 and 236 are separated by a galvanic isolation (or insulation) barrier 240. For instance, the IC that contains the transformer 250 includes insulation material, e.g., one or more layers of dielectric material such as a thin film polymer, between windings 232 and 236 to create isolation barrier 240. Isolation barrier 240 allows two systems to be electrically isolated to prevent current and voltages in one system from negatively impacting the other system, for instance by damaging or interfering with the operation of one or more components of the other system.

For example, during operation, the output signal generated by converter 202, in this case a DC output voltage $V_{ISO}$, is electrically isolated from an input signal, in this case a DC input signal $V_{CC1}$. Accordingly, two systems may be powered by different supply sources, e.g., $V_{CC1}$ and $V_{ISO}$, which do not share a common ground connection, e.g., as illustrated by separate ground connections $GND_1$ at pin 214 and $GND_2$ at pin 218. A load (not shown) may be coupled to pin 218 to receive $V_{ISO}$. While receiving $V_{ISO}$ the load draws a current, $I_{LOAD}$.

In a particular example, the transformer 250 is a laminate-based transformer having a k around 0.6-0.7, an inductance less than 100 nanohenries (nH), and a turn ratio of less than 1.5. Moreover, $V_{CC1}$ is 3-5.5 volts (V), and $V_{ISO}$ is 3.3 V or 5V pin selectable. Accordingly, in this example, converter 202 operates in buck-boost mode. Moreover, converter 202 has a resonant topology, in which transformer 250 is driven by oscillator 222 at a fixed frequency (e.g., 25 megahertz (MHz)) for optimized efficiency. Also, a parallel LC resonance from secondary winding 236 and capacitor C1 provides a Q-boosted voltage to rectifier 238, which creates a resonant peak depending on the fixed frequency.

As further illustrated, hysteretic output regulator 206 includes hysteretic control circuitry 208, hysteresis window control circuitry 210 (also referred to herein as hysteresis controller 210), and an oscillator circuit (or simply oscillator) 230. Hysteretic control circuitry 208 includes hysteretic controller 224 (e.g., a comparator with hysteresis, also referred to herein as comparator 224) and resistors R1, R2, and R3 each having respective first and second (resistor) terminals, in which resistor R2 has an adjustable resistance and is, therefore, referred to as an adjustable resistor. Also, in this example, comparator 224 is implemented as an inverting comparator. However, in an alternative example, comparator 224 is implemented as a non-inverting comparator.

As shown, resistors R1, R2, and R3 are coupled in series between nodes 207 and 211. Namely, the first terminal of resistor R1 is coupled to node 207. The second terminal of resistor R1 is coupled to the first terminal of resistor R2 at a node 215. The second terminal of resistor R2 is coupled to the first terminal of resistor R3 at a node 217, and the second terminal of resistor R3 is coupled to node 211. Also, an inverting input of comparator 224 is coupled to nodes 215 and 217, for instance through respective switches (not shown). A non-inverting input of comparator 224 is coupled to circuitry (not shown) that provides a reference voltage $V_{ref}$. An output of comparator 224 is coupled to an input of FB channel TX circuitry 228 and a (frequency) input of hysteresis controller 210 at a node 209. A (reference) input of hysteresis controller 210 is coupled to a (reference) output of oscillator 230, at which a reference frequency $f_{ref}$ is provided. An output of hysteresis controller 210 is coupled to resistor R2 at a node 213. An output of FB channel TX circuitry 228 is coupled to the first terminal of capacitor C3. A second terminal of capacitor C3 is coupled to a first terminal of capacitor C2. A second terminal of capacitor C2 is coupled to an input of FB channel RX circuitry 226. An output of FB channel RX circuitry 226 is coupled to a feedback input of power controller 220.

In this example, FB channel TX circuitry 228 and FB channel RX circuitry 226 includes circuitry for communicating a digital signal, in this case FB (also referred to as FB data), across a communication channel that includes capacitors C2 and C3 and isolation barrier 240. In a particular example, the communication channel is a dedicated channel for FB data. Moreover, in this example, FB channel TX circuitry 238 and FB channel RX circuitry 226 include circuitry that employs an ON-OFF keying (OOK) modulation scheme to transmit the FB data across the communication channel. For instance, FB channel TX circuitry 238 sends a high-frequency (e.g., 35 MHz) carrier across the communication channel to represent one state and sends no signal to represent the other state. The speed of the communication channel enables a fast transient response of the system 200. FB channel RX circuitry 226 demodulates the signal after signal conditioning and produces the output through a buffer stage to power controller 220. Example FB channel TX circuitry 228 includes an electrostatic discharge (ESD)/buffer amplifier, an oscillator, logic for facilitating the OOK modulation, and a TX signal conditioning circuit. Correspondingly, example FB channel RX circuitry 226 includes a RX signal conditioning circuit, an envelope detector that may include a rectifier circuit and a comparator circuit, and an ESD/buffer amplifier.

Figure 3:
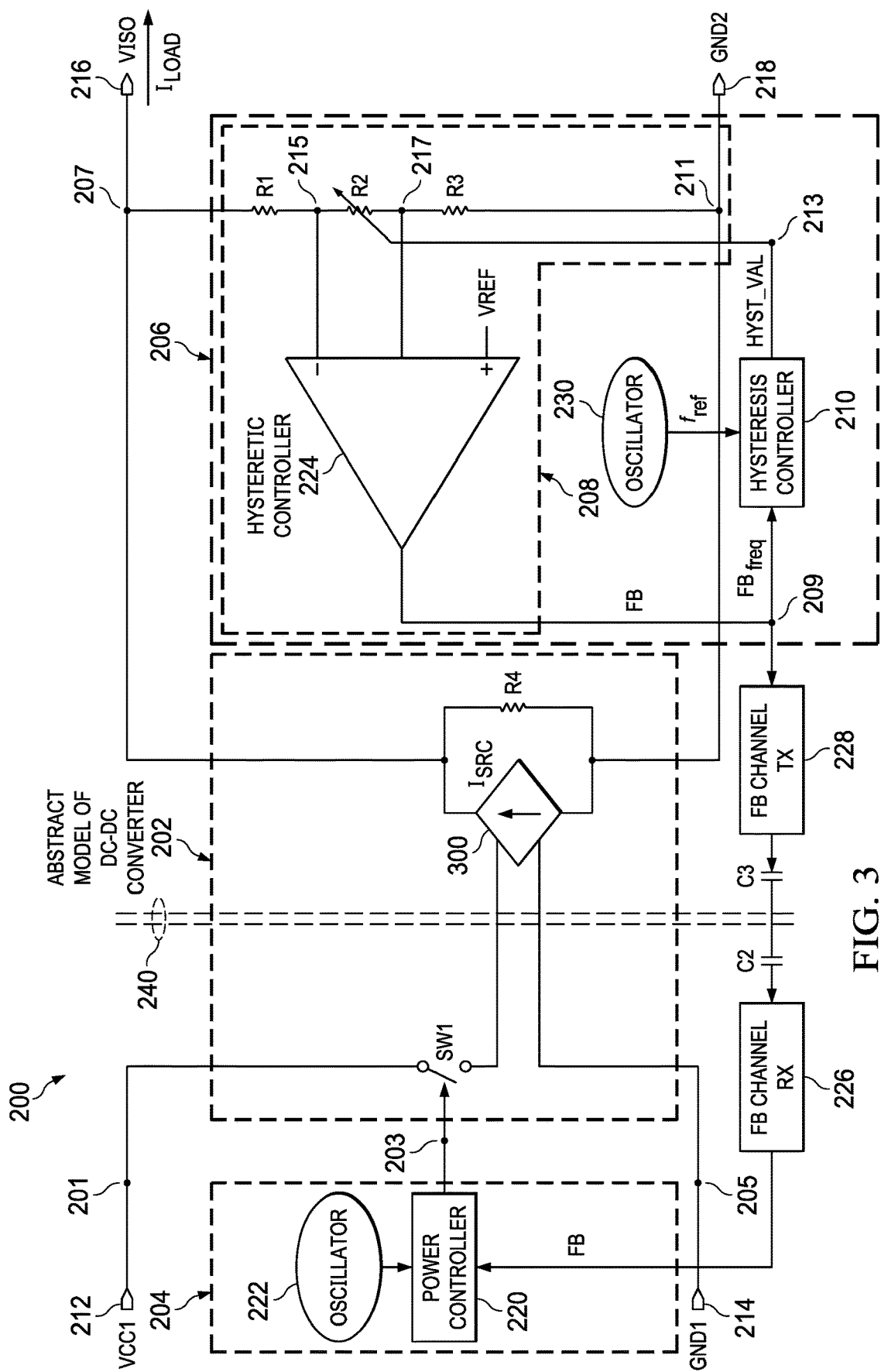
FIG. 3 is a block and schematic diagram depicting a simplified representation of the system shown in FIG. 2.

FIG. 3 is a block and schematic diagram depicting a simplified representation of system 200 shown in FIG. 2, which will be used to explain the operation of system 200 to regulate the ripple amplitude and the ripple frequency of $V_{ISO}$. Namely, the power path of converter 202 is represented in FIG. 3 as a voltage-dependent current source $I_{SRC}$ 300 having a finite impedance R4 in parallel therewith between nodes 207 and 211. Furthermore, current source $I_{SRC}$ has its conduction (or ON/OFF states) controlled by a switch SW1 coupled between nodes 201 and 205, with switch SW1 being opened and closed at a switching frequency. For example, the switching frequency is about 50 kilohertz (KHz).

Hysteretic control circuitry 208 provides closed-loop control of the ripple amplitude of $V_{ISO}$. More particularly, comparator 224 provides a signal FB used by power controller 220 to control SW1 to, thereby, regulate the ripple amplitude. Namely, comparator 224 receives $V_{ISO}$, compares a fraction of $V_{ISO}$ at node 215 to upper and lower voltage thresholds of a hysteresis window, and generates FB based on the comparison. FB (or a representation thereof, e.g., FB data) is communicated over the communication channel (as earlier described). Power controller 220 uses FB to adjust the duty cycle of SW1 to regulate the ripple amplitude relative to the upper and lower voltage thresholds of the hysteresis window. As shown, the upper and lower voltage thresholds are set by a string resistor ladder network that includes resistors R1, R2, and R3.

In this example, FB is a digital signal that switches or transitions between logic high and low signal levels (e.g., between a logic level 1 and a logic level 0) at the switching frequency. Further to this example, when the voltage at node 215 is greater than the upper voltage threshold, FB transitions from logic high to logic low. Responsively, power controller 220 turns switch SW1 to the OFF state, corresponding to converter 202 being turned off, to stop the current source $I_{SRC}$, thereby, pulling $V_{ISO}$ lower. Conversely, when the voltage at node 215 is lower than the lower voltage threshold, FB transitions from logic low to logic high. Responsively, power controller 220 turns switch SW1 to the ON state, corresponding to converter 202 being turned on, to provide the current source $I_{SRC}$, thereby, driving $V_{ISO}$ higher.

Hysteresis controller 210 provides closed-loop control of the ripple frequency of $V_{ISO}$ by adjusting the hysteresis window of comparator 224. In this example, hysteresis controller 210 adjusts the hysteresis window by adjusting the value of resistance R2. More particularly, hysteresis controller 210: monitors or detects the frequency of FB (referred to as $FB_{freq}$), which indicates the ripple frequency of $V_{ISO}$; compares $FB_{freq}$ (or a fraction thereof) to $f_{ref}$; and provides an adjustment signal and/or value HYST_VAL based on the comparison. In one example, HYST_VAL is a digital signal or code that indicates or communicates discreet values. Alternatively, HYST_VAL is an analog signal or value. HYST_VAL is used to change the value of resistor R2. As such, comparator 224 can be thought of as a voltage to frequency converter of hysteretic output regulator 206. Correspondingly, hysteresis controller 210 can be thought of as a frequency to voltage converter of hysteretic output regulator 206.

In an example, where $FB_{freq}$ (or a fraction thereof) exceeds $f_{ref}$, hysteresis controller 210 provides adjustment signal HYST_VAL to change the value of resistor R2 to enlarge the hysteresis window relative to $V_{ref}$. Enlarging the hysteresis window causes the ripple frequency to decrease. Whereas, where $FB_{freq}$ (or a fraction thereof) falls below $f_{ref}$, hysteresis controller 210 provides adjustment signal HYST_VAL to change the value of resistor R2 to shrink or tighten the hysteresis window relative to $V_{ref}$. Shrinking the hysteresis window causes the ripple frequency to increase.

Figure 4:
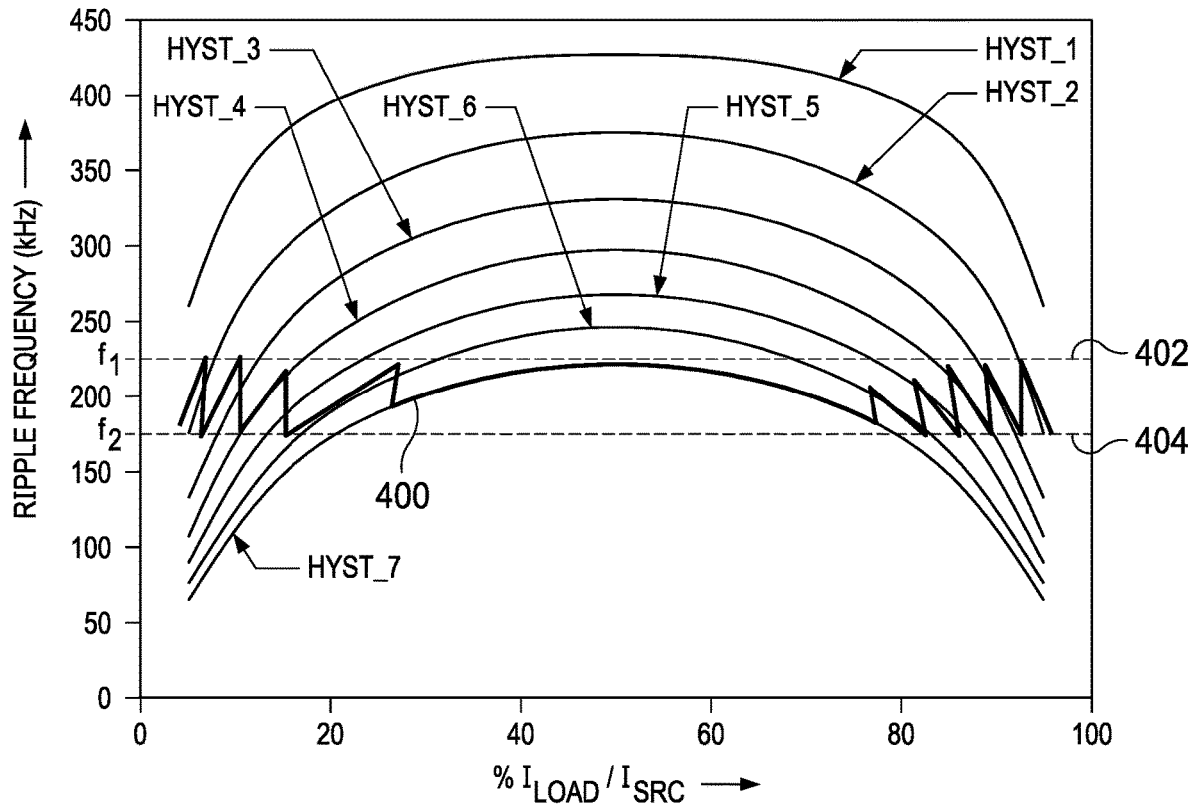
FIG. 4 depicts multiple curves illustrating respective hysteresis values that can be used during operation of the circuitry in FIGS. 2 and 3 to maintain ripple frequency of a regulated DC output signal within a target range.

FIG. 4 depicts multiple curves illustrating respective hysteresis values that can be used during operation of the circuitry in FIGS. 2 and 3 to maintain ripple frequency of a regulated DC output signal at a target level or within a target range. Seven curves labeled HYST_1-HYST_7 are shown. Each curve corresponds to a different HYST_VAL (in this case a digital code) and illustrates a graph of ripple frequency versus % $I_{LOAD}/I_{SRC}$ for different hysteresis window step sizes. In this example, the hysteresis window size increases as the HYST_VAL digital code increases. As such, HYST_1 corresponds to the smallest hysteresis window producing the highest ripple frequencies, and HYST_7 corresponds to the largest hysteresis window producing the smallest ripple frequencies.

In this example, and as illustrated, hysteresis controller 210 can change HYST_VAL between the digital codes HYST_1-HYST_7 to maintain the ripple frequency (labeled as a curve 400) between an upper frequency threshold $f_1$ (labeled as 402) and a lower frequency threshold $f_2$ (labeled as 404). As depicted, hysteresis controller 210 can operate using a hysteresis window (relative to $f_{ref}$) to minimize or prevent multiple transitions (or oscillation) at $f_{ref}$. Thus, use of the frequency hysteresis window can provide some stability to hysteretic output regulator 206. Alternatively, a single frequency threshold can be used at which hysteresis controller 210 maintains a constant or substantially constant ripple frequency.

In another example, to facilitate system stability, hysteretic output regulator 206 is implemented as a single pole system. In one example of the single pole system, the voltage to frequency conversion (performed by comparator 224) is made slower than the frequency to voltage conversion (performed by hysteresis controller 210). Alternatively, in the single pole system, the frequency to voltage conversion is made slower than the voltage to frequency conversion.

In one example single pole system, hysteresis controller 210 is configured to have a "weak" pole relative to comparator 224, in which hysteresis controller 210 adjust the hysteresis window slowly compared to the frequency of the FB signal. For instance, hysteresis controller 210 adjusts the hysteresis window every four to five cycles, e.g., ON/OFF cycles, of the FB signal. In a further example, the hysteresis controller 210 has a low gain in which hysteresis controller 210 changes HYST_VAL by only one code value at a time, namely to the next highest code value or the next lowest code value.

Figure 5:
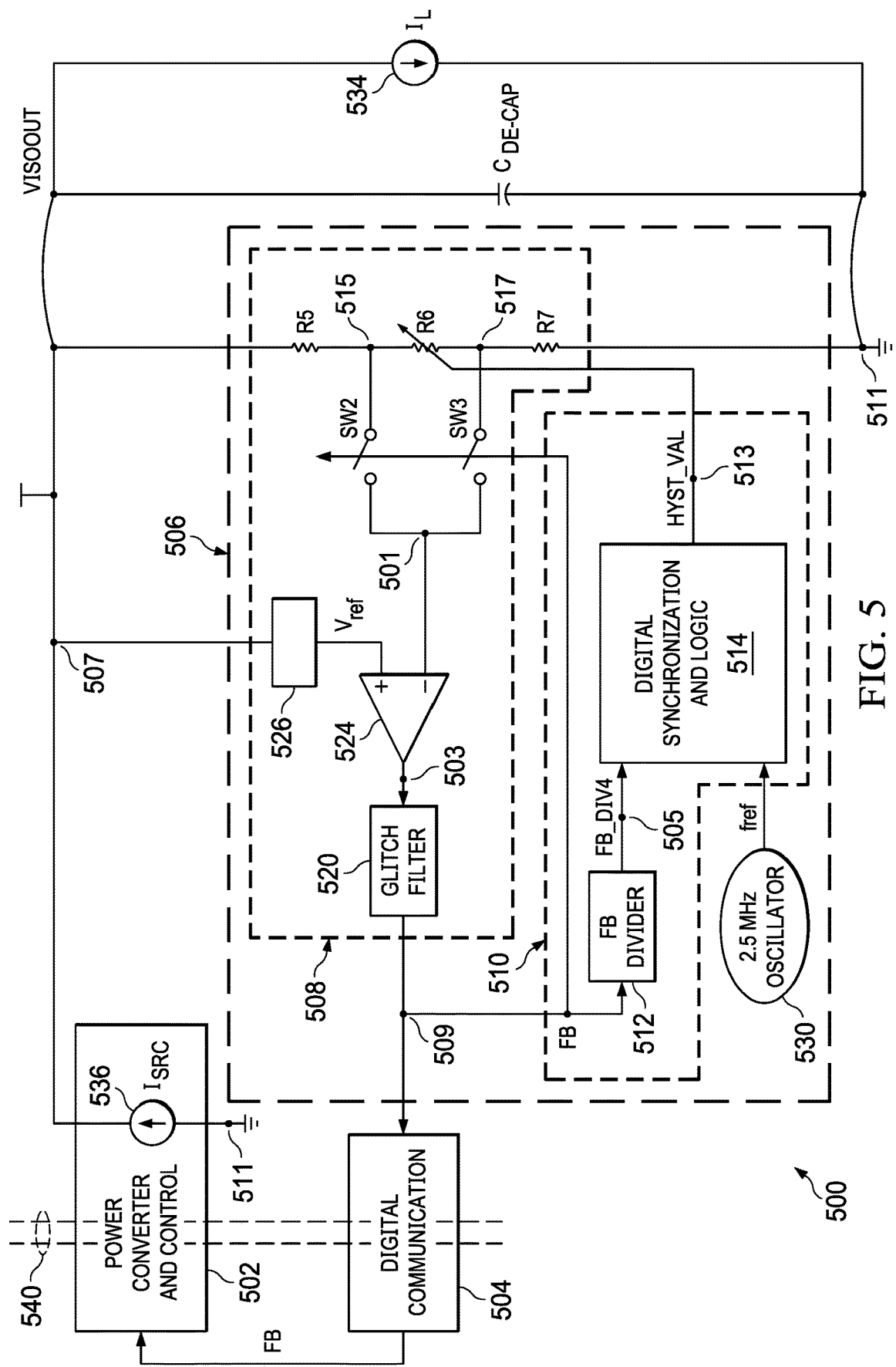
FIG. 5 is a block and schematic diagram depicting another example system including circuitry for adaptive hysteretic control of a power converter.

FIG. 5 is a block and schematic diagram depicting an example system 500 including circuitry for adaptive hysteretic control of a power converter. System 500 includes a power converter and control circuitry 502, digital communication circuitry 504, a hysteretic output regulator 506, a decoupling capacitor $C_{DE-CAP}$ having first and second (capacitor) terminals coupled to respective first and second plates, and a load 534 having first and second terminals. Load 534 is depicted in FIG. 5 as a variable current source, $I_L$, which represents the current drawn by load 534. The system 500 may be integrated into a single IC or IC package built on a single piece of silicon. Alternatively, the system 500 is integrated into multiple ICs and/or multiple IC packages (each package having one or more ICs), with the multiple ICs or IC packages coupled to or mounted on a PCB. In another example, one or more of the passive components, such as capacitors and resistors, in system 500 are discreet components.

In an example, power converter and control circuitry 502 is implemented the same as or similar to quasi-resonant DC-DC isolation converter 202 (including an isolation barrier 540) and control circuitry 204 illustrated in FIGS. 2 and 3 and described above. As such, the power path of power converter and control circuitry 502 may be represented as a voltage-dependent current source $I_{SRC}$ 536 having a finite impedance (not shown), in which current source $I_{SRC}$ has its conduction (or ON/OFF states) controlled by a switch (not shown) at a switching frequency (e.g., 50 kilohertz KHz). A first terminal of current source $I_{SRC}$ coupled to a node 511 represents a ground terminal of power converter and control circuitry 502, wherein the ground terminal is coupled to electrical ground. A second terminal of current source $I_{SRC}$ coupled to a node 507 represents an output of power converter and control circuitry 502, at which a regulated DC output voltage $V_{ISOOUT}$ is provided. Moreover, in this example, digital communication circuitry 504 is implemented the same as or similar to the collective circuitry of FB channel RX circuitry 226, FB channel TX circuitry 228, and isolation capacitors C2 and C3 illustrated in FIGS. 2 and 3 and described above.

In one example, hysteretic output regulator 506 is an implementation of hysteretic output regulator 206 of FIGS. 2 and 3 and includes hysteretic control circuitry 508, hysteresis controller 510, and an oscillator circuit (or simply oscillator) 530. Hysteretic control circuitry 508 includes: a comparator 524 having hysteresis; resistors R5, R6, and R7 each having respective first and second (resistor) terminals, in which resistor R6 has an adjustable resistance (and is, therefore, referred to as an adjustable resistor); a voltage source 526 that provides a reference voltage $V_{ref}$; a glitch filter 520; and switches SW2 and SW3 each having a respective control terminal and respective first and second (switch) terminals. In this example, comparator 524 is implemented as an inverting comparator. However, in an alternative example, comparator 524 is implemented as a non-inverting comparator. Also, switches SW2 and SW3 can be implemented as transistors operating as switches. Moreover, in this example, hysteresis controller 510 is implemented as a digital circuit, which includes a feedback (FB) frequency divider circuit 512 (also referred to herein as FB divider circuit 512) and digital synchronization and logic 514. Digital synchronization and logic 514 includes circuitry that, at a minimum, functions as an edge detector, a counter, and a digital comparator. Although not shown, the digital comparator includes a first (comparator) input coupled to FB divider 512, a second (comparator) input coupled to oscillator 530, and a (comparator) output coupled to resistor R6.

As illustrated, the first terminal of load 534 is coupled to node 507 to receive $V_{ISOOUT}$. The second terminal of load 534 is coupled to electrical ground at node 511. While receiving $V_{ISOOUT}$, load 534 draws the current $I_L$. The first terminal of capacitor $C_{DE-CAP}$ is coupled to node 507, and the second terminal of capacitor $C_{DE-CAP}$ is coupled to node 511. Resistors R5, R6, and R7 are coupled in series between nodes 507 and 511. Namely, the first terminal of resistor R5 is coupled to node 507. The second terminal of resistor R5 is coupled to the first terminal of resistor R6 at a node 515. The second terminal of resistor R6 is coupled to the first terminal of resistor R7 at a node 517, and the second terminal of resistor R7 is coupled to node 511.

Also, the first terminal of switch SW2 is coupled to node 515, and the first terminal of switch SW3 is coupled to node 517. Respective second terminals of switches SW2 and SW3 are coupled to an inverting input of comparator 524 at a node 501. A non-inverting input of comparator 524 is coupled to an output of voltage source 526. An input of voltage source 526 is coupled to node 507. An output of comparator 524 is coupled to an input of glitch filter 520 at a node 503. An output of glitch filter 520 is coupled, at a node 509, to an input of digital communication circuitry 504, an input of FB divider 512, and the respective control terminals of switches SW2 and SW3. An output of digital communication circuitry 504 is coupled to an input of power converter and control circuitry 502. An output of FB divider 512 is coupled to a (frequency) input of digital synchronization and logic 514 at a node 505. A (reference) input of digital synchronization and logic 514 is coupled to a (reference) output of oscillator 530, at which a reference frequency $f_{ref}$ is provided. In this example, oscillator 530 is a 2.5 MHz oscillator. Finally, an output of digital synchronization and logic 514 is coupled to resistor R6 at a node 513.

The operation of system 500 will be described by reference to FIG. 6, which depicts digital timing diagrams 602-612 respectively representing signals $V_{ISOOUT}$, FB, FB_DIV2 (which is the frequency of FB, $FB_{freq}$, divided by 2), FB_DIV4 (which is $FB_{freq}$ divided by 4), HYST_VAL, and the ripple frequency of $V_{ISOOUT}$. Some of these signals are indicated in FIG. 5. In this example, HYST_VAL can have the digital values indicated in FIG. 4.

Hysteretic control circuitry 508 provides closed-loop control of the ripple amplitude of $V_{ISOOUT}$. More particularly, comparator 524 compares a fraction of $V_{ISO}$ at node 515 to an upper threshold or a lower voltage threshold of a hysteresis window (depending on whether switch SW1 or SW2 is closed), and generates a signal based on the comparison. The upper and lower voltage thresholds are set by a string resistor ladder network that includes resistors R5, R6, and R7, and are provided to comparator 524 based on the states of switches SW2 and SW3. Namely, when switch SW2 is closed and switch SW3 is open, the lower voltage threshold is provided at the non-inverting input of comparator 524. Accordingly, comparator 524 compares the voltage at node 515 to the lower threshold. Conversely, when switch SW2 is open and switch SW3 is closed, the upper voltage threshold is provided at the non-inverting input of comparator 524. Accordingly, comparator 524 compares the voltage at node 517 to the upper threshold.

The signal output by comparator 524 is provided to glitch filter 520. Glitch filter 520 filters "short" pulses, from the comparator 524 output signal, which have a pulse width that is less than a minimum acceptable pulse width. Such filtering removes pulses that may make the power converter and control circuitry 502 less efficient. In this example, signal FB is the filtered signal from the output of glitch filter 520. In another example, system 500 does not include glitch filter 520. In that example, signal FB comes directly from the output of comparator 524. FB (or a representation thereof, e.g., FB data) is communicated over the communication channel (not shown) of digital communication circuitry 504. FB is used to adjust the duty cycle of the switching circuitry (not shown) power converter and control circuitry 502 to regulate the ripple amplitude relative to the upper and lower voltage thresholds of the hysteresis window.

In this example, FB is a digital signal that switches or transitions between logic high and low signal levels (e.g., between a logic level 1 and a logic level 0) at the switching frequency. Further to this example, when the voltage at node 517 is greater than the upper voltage threshold, FB transitions from logic high to logic low. Responsively, the power converter (not shown) of power converter and control circuitry 502 is turned off, to stop the current source $I_{SRC}$, thereby, pulling $V_{ISOOUT}$ lower. Conversely, when the voltage at node 515 is lower than the lower voltage threshold, FB transitions from logic low to logic high. Responsively, the power converter is turned on, to provide the current source $I_{SRC}$, thereby, driving $V_{ISOOUT}$ higher. Moreover, FB is provided to the respective control terminal of switches SW2 and SW3. When FB is at a logic low, switch SW3 is closed, and switch SW2 is opened to provide the upper voltage threshold at node 501. Conversely, when FB is at a logic high, switch SW3 is opened, and switch SW2 is closed to provide the lower voltage threshold at node 501.

Hysteresis controller 510 provides closed-loop control of the ripple frequency of $V_{ISOOUT}$ by adjusting the hysteresis window of comparator 524. In this example, hysteresis controller 510 adjusts the hysteresis window by digitally adjusting the value of resistance R6. More particularly, FB divider 512 divides the frequency of FB (referred to as $FB_{freq}$ and which indicates the ripple frequency of $V_{ISOOUT}$) by 4 to generate a signal FB_DIV4. This frequency division provides stability to hysteretic output regulator 506 by giving hysteresis controller 510 a weak pole relative to comparator 524. Although in this example FB divider 512 divides $FB_{freq}$ by 4, alternatively FB divider 512 divides $FB_{freq}$ by another integer value, such as 2, as illustrated by curve 606 depicting the FB_DIV2 signal.

Digital synchronization and logic circuitry 514 includes a digital comparator that compares FB_DIV4 to $f_{ref}$ and provides an adjustment signal and/or value HYST_VAL based on the comparison. In this example, HYST_VAL is a digital signal or code, for instance selected from the codes illustrated in FIG. 4, which indicates or communicates a corresponding discreet value to resistor R6. In a particular example, at each rising edge of the FB_DIV4 signal (for instance as indicated by 614 in FIG. 6), a counter (not shown) counts the number of clock pulses from oscillator 530 within the FB_DIV4 high pulse and compares that number to upper and lower frequency threshold values, which are based on $f_{ref}$. For example, the upper and lower frequency threshold values are 26 and 24, respectively, for a 2.5 MHz $f_{ref}$. Higher counter values indicate lower ripple frequency values, and lower counter values indicate higher ripple frequency values. Digital synchronization and logic circuitry 514 provides HYST_VAL to resistor R6 after the falling edge of the FB_DIV4 high pulse (for instance as indicated by 616 in FIG. 6) based on the results of the comparison. Accordingly, in this example, the hysteresis window is updated every four cycles of FB signal.

In this example, where FB_DIV4 falls below 24, digital synchronization and logic circuitry 514 decreases HYST_VAL to change the value of resistor R6 to shrink the hysteresis window relative to $V_{ref}$. Shrinking the hysteresis window causes the ripple frequency to increase. Whereas, where FB_DIV4 rises above 26, digital synchronization and logic circuitry 514 increases HYST_VAL to change the value of resistor R6 to enlarge the hysteresis window relative to $V_{ref}$. Enlarging the hysteresis window causes the ripple frequency to increase. In this example, frequency hysteresis is used to minimize oscillation about $f_{ref}$. Alternatively, a single reference frequency value is used to maintain or substantially maintain the ripple frequency at a constant frequency.

Figure 6:
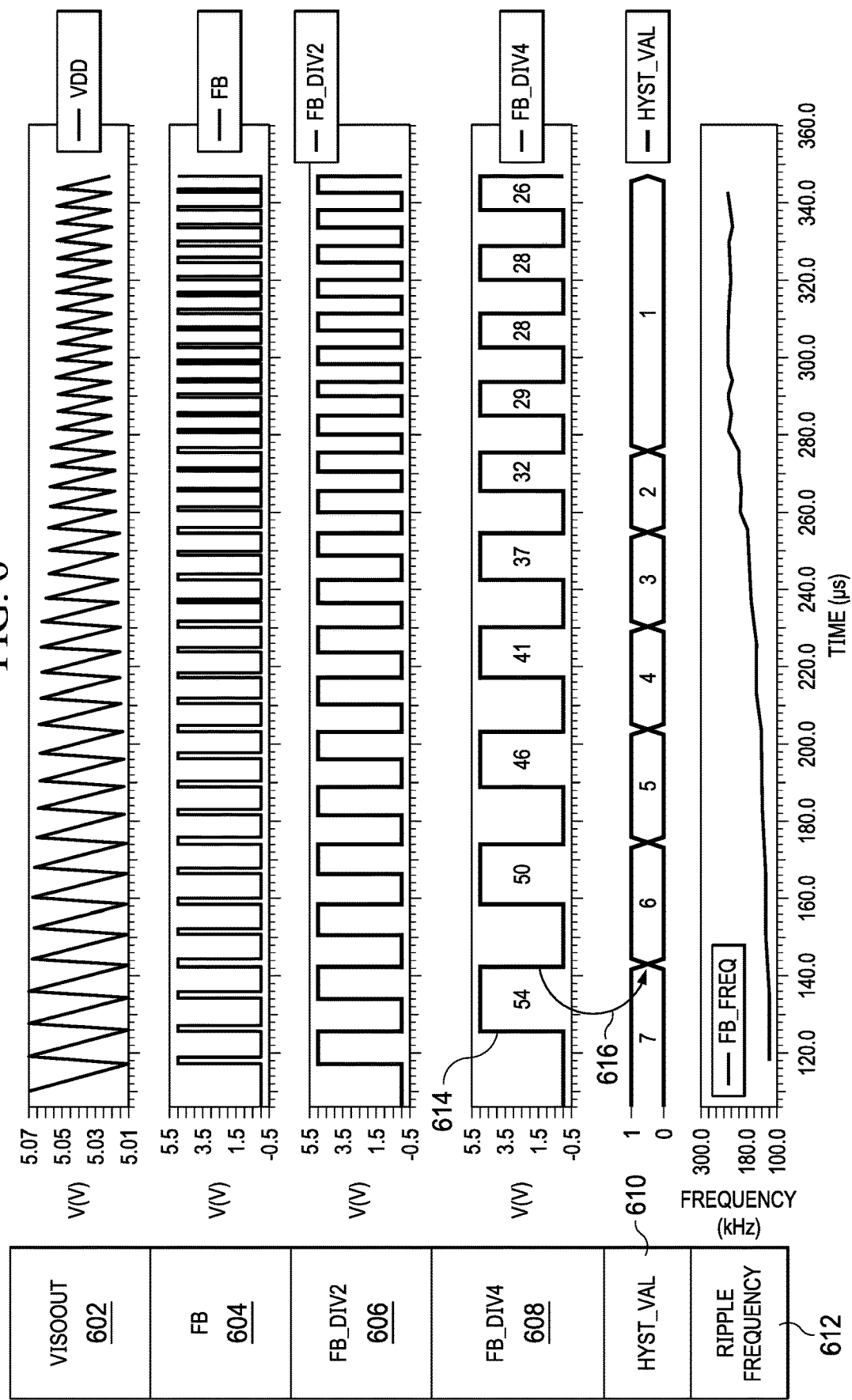
FIG. 6 depicts digital timing diagrams for operating the system shown in FIG. 5.

As further illustrated in FIG. 6, at time 0 microseconds (ρsec), HYST_VAL has an initial value of 7 to create the largest or widest hysteresis window. However, HYST_VAL can have any suitable initial value. A counter value for the first FB_DIV4 high pulse is 54, which is greater than the upper frequency threshold value of 26. Accordingly, after the falling edge of this high pulse, digital synchronization and logic circuitry 514 decreases HYST_VAL to 6, which tightens the hysteresis window and increases the ripple frequency, as indicated by the curve 612. Over the time period shown, the counter values continue to exceed the upper frequency threshold, with the exception of the counter value being 26 for the final FB_DIV4 high pulse shown. Accordingly, digital synchronization and logic circuitry 514 decreases HYST_VAL to the lowest value and leaves it there until the counter value falls below the lower frequency threshold value of 24 (not shown), wherein digital synchronization and logic circuitry 514 would begin increasing HYST_VAL. Further over the time period shown, the ripple amplitude (as indicated by the $V_{ISOOUT}$ curve 602) settles from about 56 millivolts (mV) at power up to about 29 mV, and the ripple frequency settles from about 100 kHz at start up to about 200 kHz.

Figure 7:
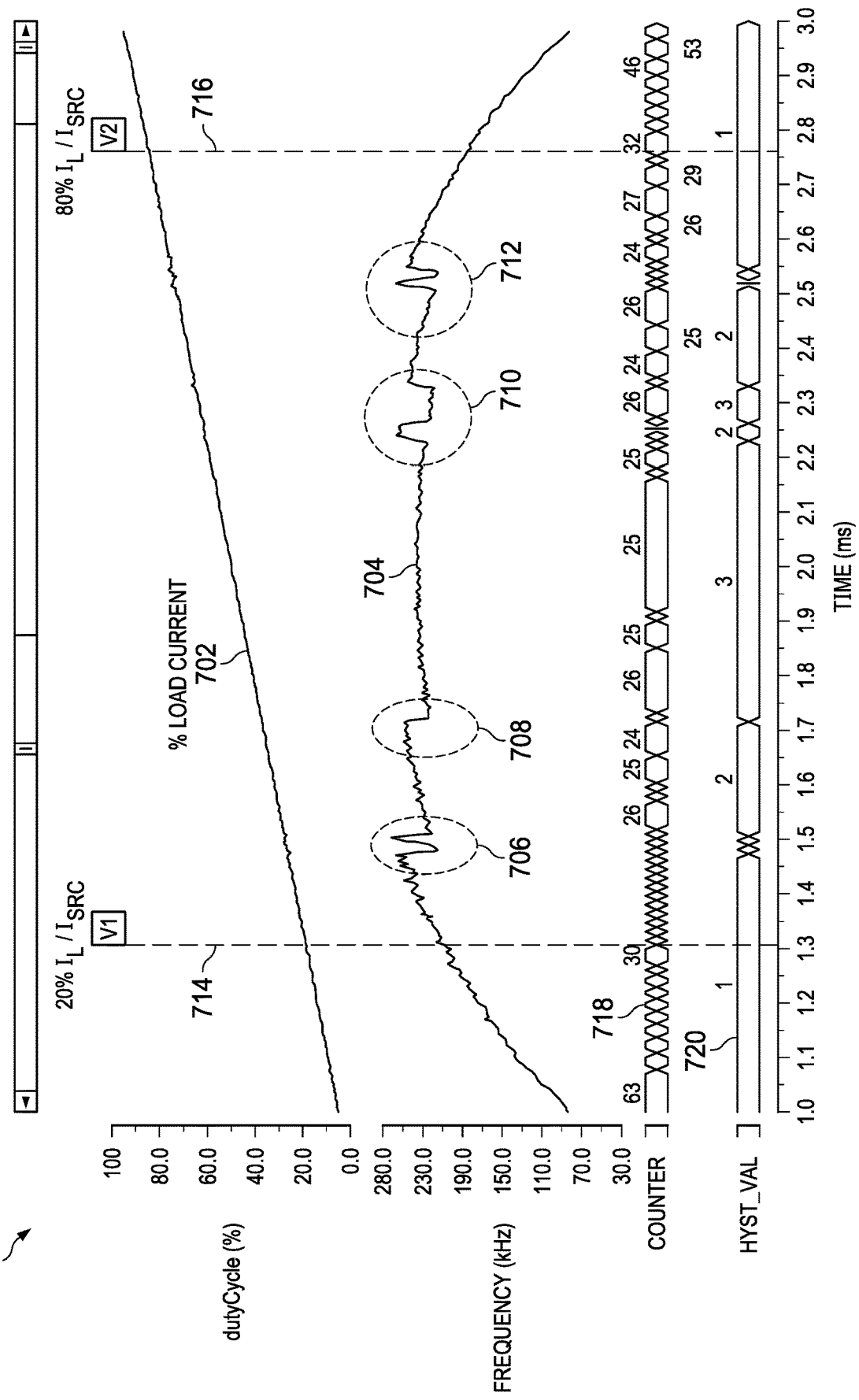
FIG. 7 depicts example simulation results for a load sweep of the system shown in FIG. 5 illustrating ripple frequency being maintained within a target range.

FIG. 7 depicts example simulation results 700 for a load sweep of system 500 shown in FIG. 5 over time, illustrating ripple frequency being maintained within a target range. A curve 702 indicates a plot of % load current. A vertical line 714 indicates 20% $I_L/I_{SRC}$ (or 20% load current), and a vertical line 716 indicates 80% $I_L/I_{SRC}$ (or 80% load current). A curve 704 indicates the ripple frequency of $V_{ISOOUT}$. A graph 718 indicates counter values determined by digital synchronization and logic circuitry 514, and a graph 720 indicates HYST_VAL determined by digital synchronization and logic circuitry 514. In this example, the upper frequency threshold value is 26, and the lower frequency threshold value is 24.

As indicated by the curves and graphs, at 1 millisecond (ms) in time, HYST_VAL is at 1 corresponding to the tightest hysteresis window. At 1 ms, the counter value is at 63, which exceeds the upper frequency threshold value. Accordingly, digital synchronization and logic circuitry 514 maintains HYST_VAL at 1 for a time to allow $FB_{freq}$ to continue to increase. Between 20% to 80% load current, digital synchronization and logic circuitry 514 operates to limit the ripple frequency to between about 220 kHz to 260 kHz by adjusting HYST_VAL accordingly. Ovals labeled 706, 708, 710, and 712 indicate times at which digital synchronization and logic circuitry 514 changes HYST_VAL to regulate the ripple frequency. Then after 80% load current, the ripple frequency decreases again even at the lower HYST_VAL and corresponding tightest hysteresis window. The performance indicated in FIG. 7 is in contrast to a system without adaptive hysteresis based on frequency, such as a system that uses PWM for output signal regulation. In a PWM system, for example, ripple frequency may steadily increase until it reaches a maximum at 50% load, wherein the ripple frequency then steadily declines.

Figure 8:
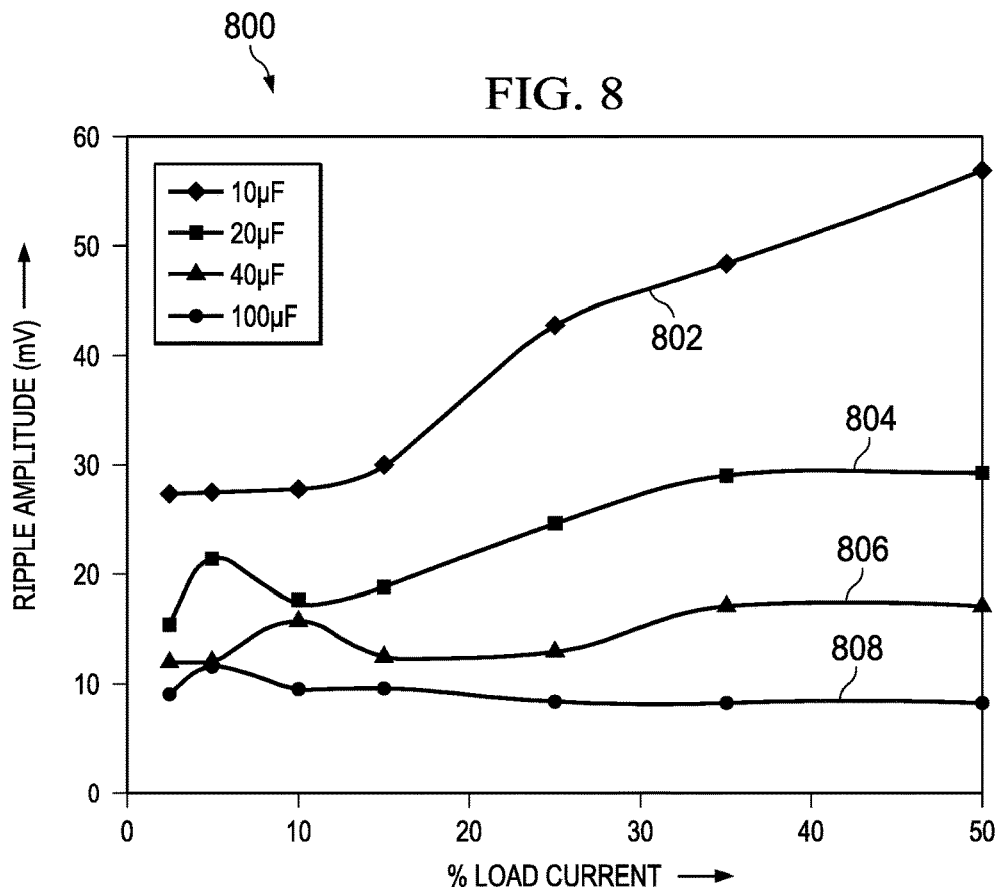
FIG. 8 depicts example simulation results for the system shown in FIG. 5 illustrating ripple amplitude plotted over percent load current for multiple values of decoupling capacitance.

FIG. 8 depicts example simulation results 800 for system 500 shown in FIG. 5, illustrating ripple amplitude plotted over percent load current (up to 50%) for multiple values of decoupling capacitance, $C_{DE-CAP}$. In plot 802, $C_{DE-CAP}$ is 10 microfarads (μF). In plot 804, $C_{DE-CAP}$ is 20 μF. In plot 806, $C_{DE-CAP}$ is 40 μF. In plot 808, $C_{DE-CAP}$ is 100 μF. These plots illustrate that ripple amplitude scales with load current in system 500, similar to systems that use hysteretic control with a fixed hysteresis window for output signal regulation. Namely, as the percent load current increases, even at the largest $C_{DE-CAP}$ value indicated, ripple amplitude is controlled to within 30 mV. Also, at the lower $C_{DE-CAP}$ values, very good ripple amplitude is achieved, e.g., to within 20 mV.

Figure 9:
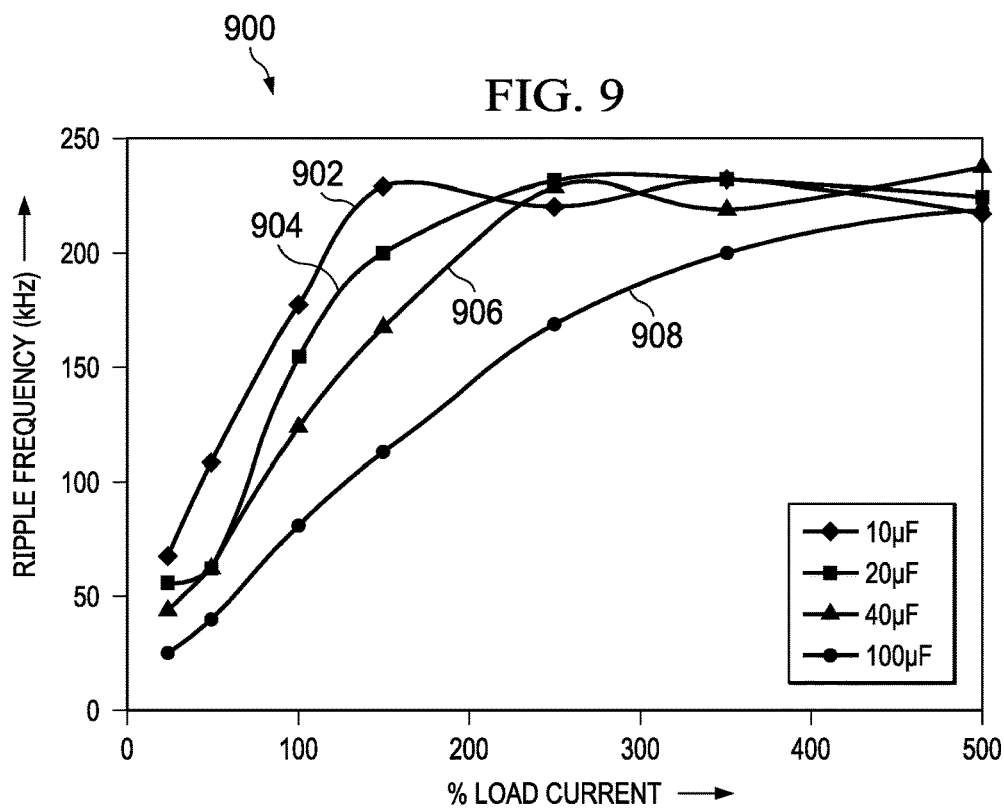
FIG. 9 depicts example simulation results for the system shown in FIG. 5 illustrating ripple frequency plotted over percent load current for multiple values of decoupling capacitance.

FIG. 9 depicts example simulation results for system 500 shown in FIG. 5, illustrating ripple frequency plotted over percent load current for multiple values of decoupling capacitance, $C_{DE-CAP}$. In plot 902, $C_{DE-CAP}$ is 10 microfarads (μF). In plot 904, $C_{DE-CAP}$ is 20 μF. In plot 906, $C_{DE-CAP}$ is 40 μF. In plot 908, $C_{DE-CAP}$ is 100 μF. These plots illustrate that, contrary to using a fixed hysteretic control window for output signal regulation, system 500 also provides tighter control over ripple frequency for multiple $C_{DE-CAP}$ values. In the particular circuit implementation of system 500, a minimum load is needed to reach the desired frequency range. However, this is application specific and depends at least in part on one or more parameters such as selected frequency, $C_{DE-CAP}$ value, etc.

Figure 10:
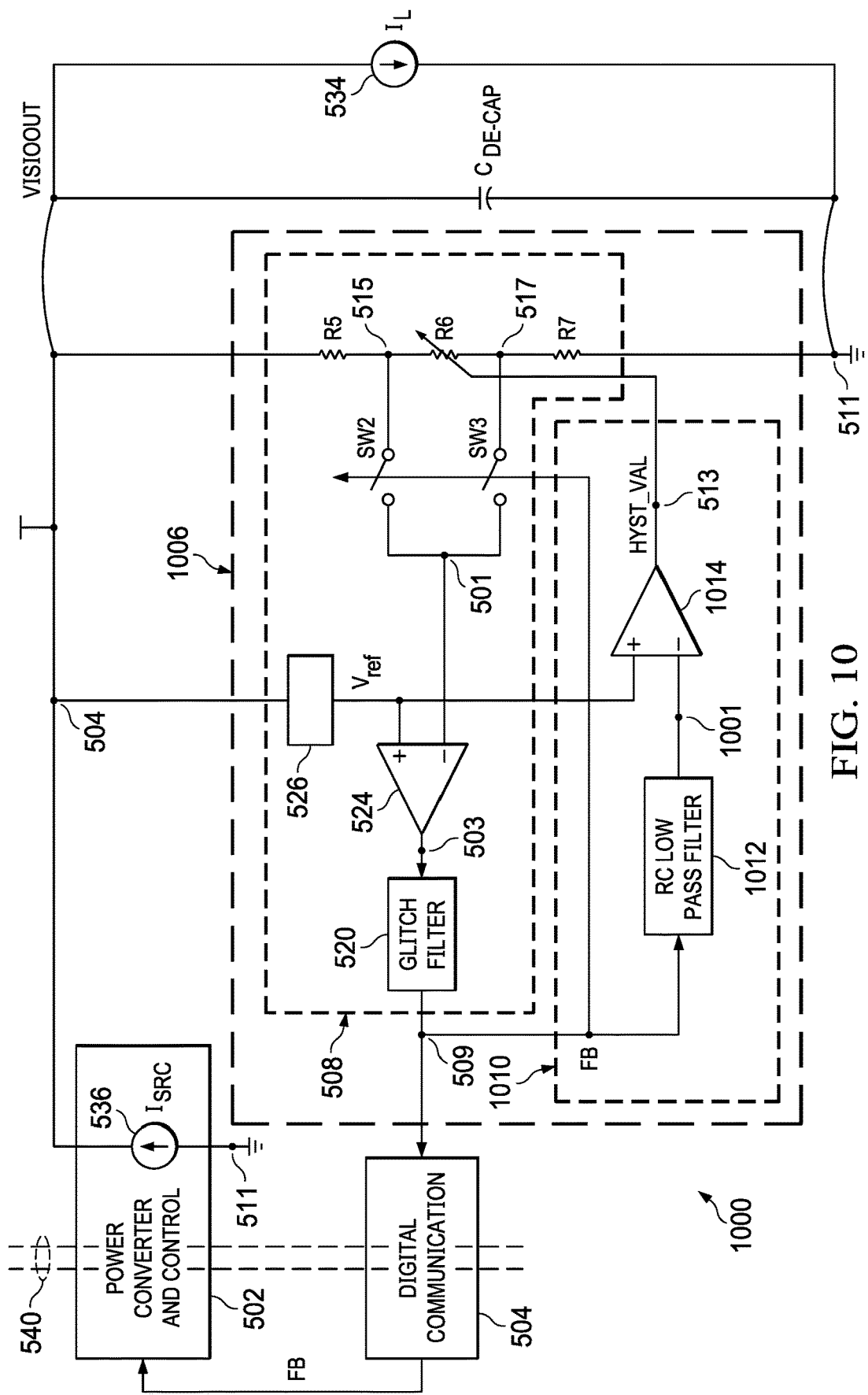
FIG. 10 is a block and schematic diagram depicting another example system including circuitry for adaptive hysteretic control of a power converter.

FIG. 10 is a block and schematic diagram depicting an example system 1000 including circuitry for adaptive hysteretic control of a power converter. The system 1000 may be integrated into a single IC or IC package built on a single piece of silicon. Alternatively, the system 1000 is integrated into multiple ICs and/or multiple IC packages (each package having one or more ICs), with the multiple ICs or IC packages coupled to or mounted on a PCB. In another example, one or more of the passive components, such as capacitors and resistors, in system 500 are discreet components.

System 1000 includes power converter and control circuitry 502, digital communication circuitry 504, a hysteretic output regulator 1006, a decoupling capacitor $C_{DE-CAP}$ having first and second (capacitor) terminals coupled to respective first and second plates, and a load 534 having first and second terminals. The hysteretic output regulator 1006 includes hysteretic control circuitry 508 and a hysteresis controller 1010. As indicated by the same reference numbers, power converter and control circuitry 502, digital communication circuitry 504, hysteretic control circuitry 508, decoupling capacitor $C_{DE-CAP}$, and load 534 are coupled within system 1000 and implemented as described by reference to FIG. 5. However, in this example, the hysteresis controller 1010 has an analog implementation.

Namely, hysteresis controller 1010 includes a low pass filter 1012 and an analog comparator 1014. In this example, low pass filter 1012 is an RC low pass filter that includes one or more resistors and one or more capacitors. As illustrated, a (filter) input of low pass filter 1012 is coupled to node 509 and a (filter) output of low pass filter 1012 is coupled to an inverting input of comparator 1014 at a node 1001. A non-inverting input of comparator 1014 is coupled to the non-inverting input of comparator 524 and to the output of voltage source 526. A (comparator) output of comparator 1014 is coupled to resistor R6 at node 513. Also, in this example, comparator 1014 is implemented as an inverting comparator. However, in an alternative example, comparator 1014 is implemented as a non-inverting comparator. Moreover, comparator 1014 may include hysteresis in one example.

During operation, RC low pass filter 1012 acts as a frequency to voltage converter depending, at least in part, on an RC time constant set for the filter. In this example, higher frequencies of the FB signal reduce the output voltage of RC low pass filter 1012, and lower frequencies of the FB signal increase the output voltage of RC low pass filter 1012. Accordingly, when the frequency of the FB signal is higher than a reference frequency value, the output voltage of RC low pass filter 1012 will be lower than $V_{ref}$. This causes comparator 1014 to provide an adjustment value that changes the resistance of R6 to cause an increase to the hysteresis window to decrease the ripple frequency. Conversely, when the frequency of the FB signal is lower than the reference frequency value, the output voltage of RC low pass filter 1012 will be higher than $V_{ref}$. This causes comparator 1014 to provide an adjustment value that changes the resistance of R6 to cause a reduction of the hysteresis window to increase the ripple frequency.

Figure 11:
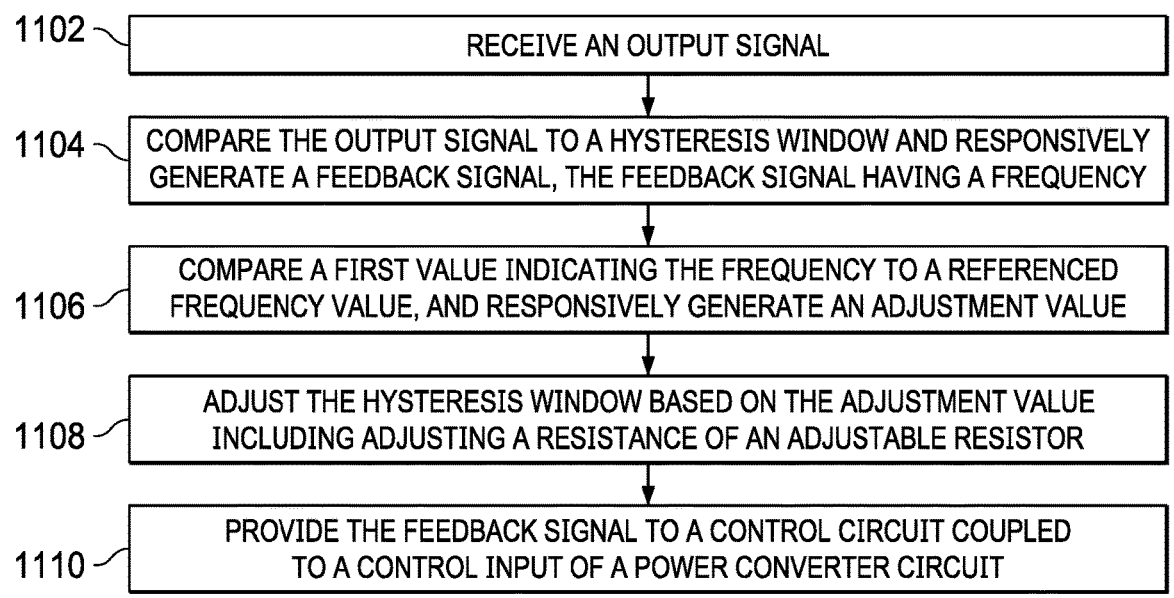
FIG. 11 is a flow diagram depicting a method for adaptive hysteretic control of a power converter.

FIG. 11 is a flow diagram depicting a method 1100 for adaptive hysteretic control of a power converter. For example, method 1100 is performed by one or more of the systems 100, 200, 300, 500, or 1000 described above. Method 1100 includes functionality shown in blocks 1002-1010, but may include additional functionality not illustrated therein but which is consistent with operating one or more of the systems described herein or additional systems consistent with the example systems described herein.

As shown, according to method 1100, the system receives (at block 1102) an output signal. For example, the output signal is or is based on a signal at an output of a power converter. For instance, a voltage ladder circuit provides an output signal to a first comparator. The output signal is a fraction of the signal at the output of the power converter. The first comparator compares (at block 1104) the output signal to a hysteresis window and responsively generates a feedback signal, which has a frequency. In an example, the feedback signal appears at the output of the first comparator. In another example, the signal at the output of the first comparator is filtered by a glitch filter, and the feedback signal appears at the output of the glitch filter.

A second comparator, either a digital or an analog comparator, compares (at block 1106) a first value indicating the frequency to a reference frequency value, and responsively generates an adjustment value. In one example, the first value is included in a signal at an output of a frequency divider. In another example, the first value is included in a signal at an output of a lowpass filter. In another example, the first value is the frequency of the feedback signal. Also, in an example, the second comparator has hysteresis. Accordingly, the reference frequency value is a first threshold value of a frequency hysteresis window, which also includes a second threshold value.

The system adjusts (at block 1108) the hysteresis window based on the adjustment value to maintain a frequency of the signal at the output of the power converter within one or more threshold frequency values. For example, adjusting the hysteresis window includes adjusting a resistance of an adjustable resistor based on the adjustment value. Moreover, the system provides (at block 1110) the feedback signal to a control circuit coupled to a control input of the power converter circuit in order to regulate the signal at the output of the power converter to maintain the amplitude of the signal within the hysteresis window.

In the description and in the claims, the terms "including" and "having" and variants thereof are intended to be inclusive in a manner similar to the term "comprising" unless otherwise noted. Unless otherwise stated, "about," "approximately," or "substantially" preceding a value means+/−10 percent of the stated value. In another example, "about," "approximately," or "substantially" preceding a value means+/−5 percent of the stated value. IN another example, "about," "approximately," or "substantially" preceding a value means+/−1 percent of the stated value.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple", "coupled", "couples", or variants thereof, includes an indirect or direct electrical or mechanical connection.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, a "terminal" of a component, device, system, circuit, integrated circuit, or other electronic or semiconductor component, refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes are shown. However, depending on a particular circuit or system topology, there may be more or fewer terminals and nodes. The terms "terminal", "node", "interconnect", "pad", and "pin" may be used interchangeably.

Modifications are possible in the described examples, and other examples are possible, within the scope of the claims.

What is claimed is:

1. An apparatus comprising:
  a first control circuit having an output and including:
    a resistor having a resistance that is adjustable, having a control input, and having first and second terminals;
    a first comparator with a hysteresis window that is adjustable responsive to a change in the resistance of the resistor, the first comparator having an input;
    a first switch having a control terminal coupled to the output of the first control circuit, in which the first switch is coupled between the first terminal of the resistor and the input of the first comparator; and
    a second switch having a control terminal coupled to the output of the first control circuit, in which the second switch is coupled between the second terminal of the resistor and the input of the first comparator; and
  a second control circuit coupled to the output of the first control circuit, the second control circuit including a second comparator having an output coupled to the control input of the resistor, the second comparator configured to:
    compare a first value to a reference value, the first value indicating a frequency of a signal at the output of the first control circuit; and
    provide an adjustment value to adjust the resistance of the resistor.

2. The apparatus of claim 1, wherein the resistor is a first resistor, and the first control circuit further includes:
  a second resistor having a terminal coupled to the first terminal of the first resistor; and
  a third resistor having a terminal coupled to the second terminal of the first resistor.

3. The apparatus of claim 2, wherein the first comparator has an output, and the first control circuit further includes a filter circuit having an input and an output, the input of the filter coupled to the output of the first comparator, and the output of the filter coupled to the second control circuit.

4. The apparatus of claim 2, wherein the input of the first comparator is a first input, the first comparator has a second input, and the first control circuit further includes a voltage reference source coupled to the second input of the first comparator.

5. The apparatus of claim 1, wherein the second comparator is a digital comparator.

6. The apparatus of claim 5, wherein the digital comparator has an input, and the second control circuit further includes a frequency divider circuit coupled between the output of the first control circuit and the input of the digital comparator.

7. The apparatus of claim 6, wherein the input of the digital comparator is a first input, the digital comparator has a second input, and the apparatus further comprising an oscillator circuit coupled to the second input of the digital comparator.

8. The apparatus of claim 1, wherein the input of the first comparator is a first input, the first comparator has a second input, the second comparator is an analog comparator having first and second inputs, the first inputs of the first and second comparators are coupled together, and the second control circuit further includes:
 a lowpass filter coupled between the output of the first control circuit and the second input of the second comparator.

9. An apparatus comprising:
 a first circuit including:
  a power converter having a control input, a ground input, and a converter output; and
  a first control circuit having a feedback input and a control output, the control output coupled to the control input;
 a second control circuit having a feedback output coupled to the feedback input, the second control circuit including:
  a first resistor first and second terminals, the second terminal coupled to the converter output;
  a second resistor having a resistance that is adjustable, having a first terminal coupled to the first terminal of the first resistor, having a second terminal, and having a control input;
  a third resistor having a second terminal coupled to the second terminal of second resistor, and having a first terminal coupled to the ground input;
  a first comparator with a hysteresis window that is adjustable responsive to a change in the resistance of the second resistor; and
 a third control circuit coupled to the feedback output, the third control circuit including a second comparator having an output coupled to the control input of the second resistor, the second comparator configured to:
  compare a first value to a reference value, the first value indicating a frequency of a signal at the feedback output; and
  provide an adjustment value to adjust the resistance of the second resistor.

10. The apparatus of claim 9, wherein the first comparator has an input, and the second control circuit further includes:
 a first switch coupled between the first terminal of the second resistor and the input of the first comparator; and
 a second switch coupled between the second terminal of the second resistor and the input of the first comparator.

11. The apparatus of claim 9, wherein the second control circuit further includes a filter circuit having an input and an output, the input of the filter coupled to an output of the first comparator, and the output of the filter coupled to the second control circuit.

12. The apparatus of claim 9, wherein the second comparator is a digital comparator.

13. The apparatus of claim 12, wherein the third control circuit further includes a frequency divider circuit coupled between the feedback output and an input of the digital comparator.

14. The apparatus of claim 9, wherein the input of the first comparator is a first input, the first comparator has a second input, the second comparator is an analog comparator having first and second inputs, the second inputs of the first and second comparators are coupled together, and the third control circuit further includes:
 a lowpass filter coupled between the feedback output and the first input of the second comparator.

15. A method comprising:
 receiving an output signal;
 comparing the output signal to a hysteresis window and responsively generating a feedback signal, the feedback signal having a frequency;
 comparing a first value indicating the frequency to a reference frequency value, and responsively generating an adjustment value, wherein the reference frequency value is a first threshold value of a frequency hysteresis window also including a second threshold value; and
 adjusting the hysteresis window based on the adjustment value.

16. The method of claim 15, wherein the first value is included in a signal at an output of a lowpass filter.

17. The method of claim 15, wherein the output signal is based on a signal at an output of a power converter, and the method further comprising providing the feedback signal to a control circuit coupled to a control input of the power converter circuit.

18. The method of claim 15, wherein adjusting the hysteresis window includes adjusting a resistance of an adjustable resistor based on the adjustment value.

19. A method comprising:
 receiving an output signal;
 comparing the output signal to a hysteresis window and responsively generating a feedback signal, the feedback signal having a frequency;
 comparing a first value indicating the frequency to a reference frequency value, and responsively generating an adjustment value, wherein the first value is included in a signal at an output of a frequency divider; and
 adjusting the hysteresis window based on the adjustment value.

* * * * *